United States Patent [19]
Kresge et al.

[11] Patent Number: 5,736,679
[45] Date of Patent: Apr. 7, 1998

[54] DEFORMABLE INTERCONNECT STRUCTURE FOR CONNECTING AN INTERNAL PLANE TO A THROUGH-HOLE IN A MULTILAYER CIRCUIT BOARD

[75] Inventors: John Steven Kresge, Binghamton, N.Y.; David Noel Light, Friendsville, Pa.; James Robert Wilcox, Vestal, N.Y.

[73] Assignee: International Business Machines Corporation, Armonk, N.Y.

[21] Appl. No.: 579,618

[22] Filed: Dec. 26, 1995

[51] Int. Cl.$^6$ ............................................. H05K 1/00
[52] U.S. Cl. ..................... 174/250; 29/830; 174/266; 361/792
[58] Field of Search ..................... 174/261, 262, 174/266, 255, 250; 361/748, 792, 794, 803; 428/134; 29/830

[56] References Cited

U.S. PATENT DOCUMENTS

| | | | |
|---|---|---|---|
| 2,869,040 | 1/1959 | Pifer | 174/261 |
| 4,295,184 | 10/1981 | Roberts | 361/774 |
| 4,663,840 | 5/1987 | Ubbens et al. | 29/853 |
| 4,851,614 | 7/1989 | Duncan, Jr. | 174/68.5 |
| 4,970,624 | 11/1990 | Arneson et al. | 361/749 |
| 5,189,261 | 2/1993 | Alexander et al. | 174/263 |
| 5,191,174 | 3/1993 | Chang et al. | 174/266 |
| 5,280,414 | 1/1994 | Davis et al. | 361/795 |
| 5,359,767 | 11/1994 | Chen et al. | 29/830 |
| 5,363,280 | 11/1994 | Chobot et al. | 361/794 |
| 5,414,223 | 5/1995 | Suski et al. | 174/262 |

*Primary Examiner*—Kristine L. Kincaid
*Assistant Examiner*—Kristina Soderquist
*Attorney, Agent, or Firm*—Baker Maxham Jester & Meador

[57] ABSTRACT

A novel through-hole interconnect for connecting a power plane conductor to a through-hole includes a central pad connected to the through-hole and a deformable hinge that connects the central pad with the power plane conductor in a multilayer circuit board. The central pad and hinge are defined by a non-continuous area removed from the plane conductor. Preferably this area has a C-shape. During the compression process to join the core assemblies, deformation of the hinge advantageously absorbs the shear forces and allows the power plane beyond the hinge to remain substantially planar. The resulting multilayer laminated circuit board includes a plurality of cores laminated together in a stacked configuration and a plurality of plated throughholes defined in said multilayer laminated circuit board each of which is connected to a plane conductor by a hinge deformed so that the interconnect area is aligned outside of a plane defined by the plane conductor. The hinged interconnect avoids shearing problems and thereby improves the reliability of the connection between the through-hole and the power plane, increasing the manufacturing yield and reducing costs. Furthermore, the hinged interconnect minimizes or eliminates internal plane distortion over the signal lines because the reference plane deformation is localized and the signal lines lie substantially outside the area of localized deformation and therefore the impedance seen by the signal lines is substantially unaffected by the compression-induced deformation.

14 Claims, 8 Drawing Sheets

DEFORMABLE INTERCONNECT STRUCTURE FOR CONNECTING AN INTERNAL PLANE TO A THROUGH-HOLE IN A MULTILAYER CIRCUIT BOARD

BACKGROUND OF THE INVENTION

1. Field of the Invention

The present invention relates to high density multilayer printed circuit board (PCB) composites, and more particularly relates to electrical interconnections between internal power planes and through-holes.

2. Description of the Related Art

Performance improvements in high speed computers can be obtained by improving the performance of the printed circuit boards (PCBs) upon which components are mounted and through which signals are routed. Multilayer printed circuit boards, including the high density type, include several electrically conductive layers separated by layers of dielectric material. Some of these conductive layers are utilized as power planes while other conductive layers may be etched in a complex pattern to provide electrical signal passageways (e.g. between integrated circuit chips). In those situations where electrical interconnections are desired between adjacent conducting layers, it has been common in the art to provide such connections using "plated-through-holes" (PTHs), sometimes referred to as just "through-holes" or "vias". These through-holes typically extend through one or more cores, and may open to one or both of the external surfaces of the multilayer structure. Through-holes typically have a plating of an electrically conductive material (e.g., copper), around their inside perimeter. As used herein, the term "through-hole" is meant to include the aforementioned PTHs as well as "vias" that may only interconnect selected conductive layers in the final structure (and thus possibly be only internally positioned).

Multilayer printed circuit board constructions typically utilize copper or a similar highly conductive material for the signal and/or power planes, the various through-holes and other conductive layers or lines. The term "printed circuit board" as used herein is thus meant to define a structure including at least one dielectric layer and at least one conductive layer located therein and/or thereon. One well known example of a dielectric material for use in such construction is fiberglass reinforced epoxy resin (e.g. FR4). Other materials may include polyimide and polytetrafluoroethylene (PTFE).

Multilayer printed circuit board constructions are formed by combining a plurality of smaller, independently formed printed circuit board structures termed "cores". Each core assembly is manufactured and tested separately before lamination to the other cores. The manufacturing process for each core includes etching the various layers in a predetermined pattern and laminating them to form a core assembly. Conventionally, through-holes are formed only after the cores have been laminated to form the complete multilayer structure, by drilling an aperture in the multilayer structure and electro-plating the interior to electrically connect the conductive layers through which the through-hole has been drilled. In an improved process, such as described in U.S. Pat. No. 5,359,797, to Chen, et al., the through-holes are formed separately in each core before forming a multilayer structure by drilling an aperture in each core and then electro-plating the interior and an area surrounding the opening to form a conductive through-hole and via lands. The multilayer assembly is formed by lamination, including compressing the core assemblies together to close gaps created by accumulated process and material tolerances, and to assure intimate contact for all through-holes and mechanical bonding of the external dielectric layers.

U.S. Pat. No. 5,359,797, to Chen, et al. discloses a method of making a multilayer circuit board comprised of individual layered subassemblies each including electrically conductive wiring and at least one through-hole. The resulting multilayer structure is characterized by the provision of at least two of these core subassemblies bonded together such that respective through-holes of each are aligned, engaged, and coupled through formation of a metallurgical bond at the through-hole jointure. Such a bond is achieved through use of heat and pressure in the presence of precise quantities of selected metals (e.g., gold and tin) at the jointure location. The through-holes have a pre-established configuration including a precisely defined sidewall thickness that allows compression of the sidewalls during application of designated pressure at a designated temperature. Compression of the through-holes assures effective engagement of all aligned through-hole combinations, so that a sound electrical connection can be made throughout the entire final PCB structure. Compression also closes the gaps between adjacent cores, advantageously providing a mechanically sound structure.

Unfortunately, compression of the core assemblies also causes local deformation of the power planes and signal lines that connect to the compressed through-holes, due to the change in relative position of the connection with respect to the through-hole. The deformation has particularly serious effects on power planes, which resist deformation more than the signal lines which have more flexibility to extend. Conventional connections between the power plane and the through-holes are direct (i.e., the through-hole is connected directly to a hole drilled in the power plane). In some instances, the power plane connection can actually shear or break away due to the deformation caused by through-hole compression. Even if the connection does not shear, the effects can be disastrous because deformation of the power plane connection forces the power plane closer to the signal line, causing an impedance discontinuity. Because a multilayer structure may have thousands of such through-holes, and a signal may pass by many through-holes during operation, each encounter degrading the signal a little more, the resultant effect of the large number of impedance discontinuities can be significant impedance-related signal degradation.

It would be an advantage to provide a connection between a through-hole and a power plane that allows the through-holes in a multilayer structure to be compressed without damaging the power plane and without substantially affecting the impedance of the resulting structure. Such an interconnection would provide a reliable connection for a high performance multilayer circuit board.

SUMMARY OF THE INVENTION

A novel through-hole interconnect for connecting a power plane conductor to a through-hole is disclosed that advantageously avoids shearing problems and minimizes or eliminates internal plane distortion over the signal lines. The through-hole interconnect includes a central pad comprising a conductive material that has a connection aperture to connect to the through-hole. The central pad is connected to one side of a hinge, which on its other side is connected to the power plane. During the compression process to join the core assemblies, deformation of the hinge advantageously absorbs the shear forces and allows the power plane beyond the hinge to remain substantially planar. The hinged interconnect improves the reliability of the connection between the through-hole and the power plane, thereby increasing the manufacturing yield and reducing costs. Furthermore, because the reference plane deformation is localized and the signal lines lie substantially outside the area of localized deformation, the impedance seen by the signal lines is substantially unaffected by the compression-induced deformation.

The method of making a multilayer circuit is described herein comprises the step of forming a first core circuit board that includes a plane conductor. A non-continuous area is removed (i.e. etched) from the plane conductor so that the removed area substantially surrounds a predetermined location for a through-hole in said plane conductor. The remaining conductive material defines a hinge coupled to the plane conductor and a central pad coupled to the hinge and through-hole. The method includes laminating the first core circuit board including connecting the plane conductor and a plurality of dielectric layers to form a first core circuit board. A through-hole is formed in the first core, the through-hole extending through the central pad. A second core circuit board is formed, and the first and second core circuit boards are connected, including the step of aligning the first and second core circuit boards, compressing and heating the core circuit boards, and deforming the hinge in the plane conductor so that the central pad is in a different plane than the plane conductor.

The area etched in the plane conductor has any shape, including any curved or polygonal shapes suitable to form a hinge. In one embodiment, this area comprises a semi-circular shape, and in another, a semi-rectangular shape.

The resulting multilayer laminated circuit board comprises a plurality of core assemblies laminated together in a stacked configuration and a plurality of plated through-holes defined in said multilayer laminated circuit board. At least one of said cores includes a plane conductor having a main body that is substantially planar, a deformed hinge connected to said main body, and an interconnect area coupled to said hinge. The interconnect area includes a conductive pad electrically coupled to said through-hole and said hinge and an etched area surrounding said conductive pad. The hinge is deformed so that the interconnect area is aligned outside of a plane defined by the plane conductor.

BRIEF DESCRIPTION OF THE DRAWINGS

For a more complete understanding of this invention, reference is now made to the following detailed description of the embodiments as illustrated in the accompanying drawing, wherein.

DETAILED DESCRIPTION OF THE PREFERRED EMBODIMENT

Figure 1:
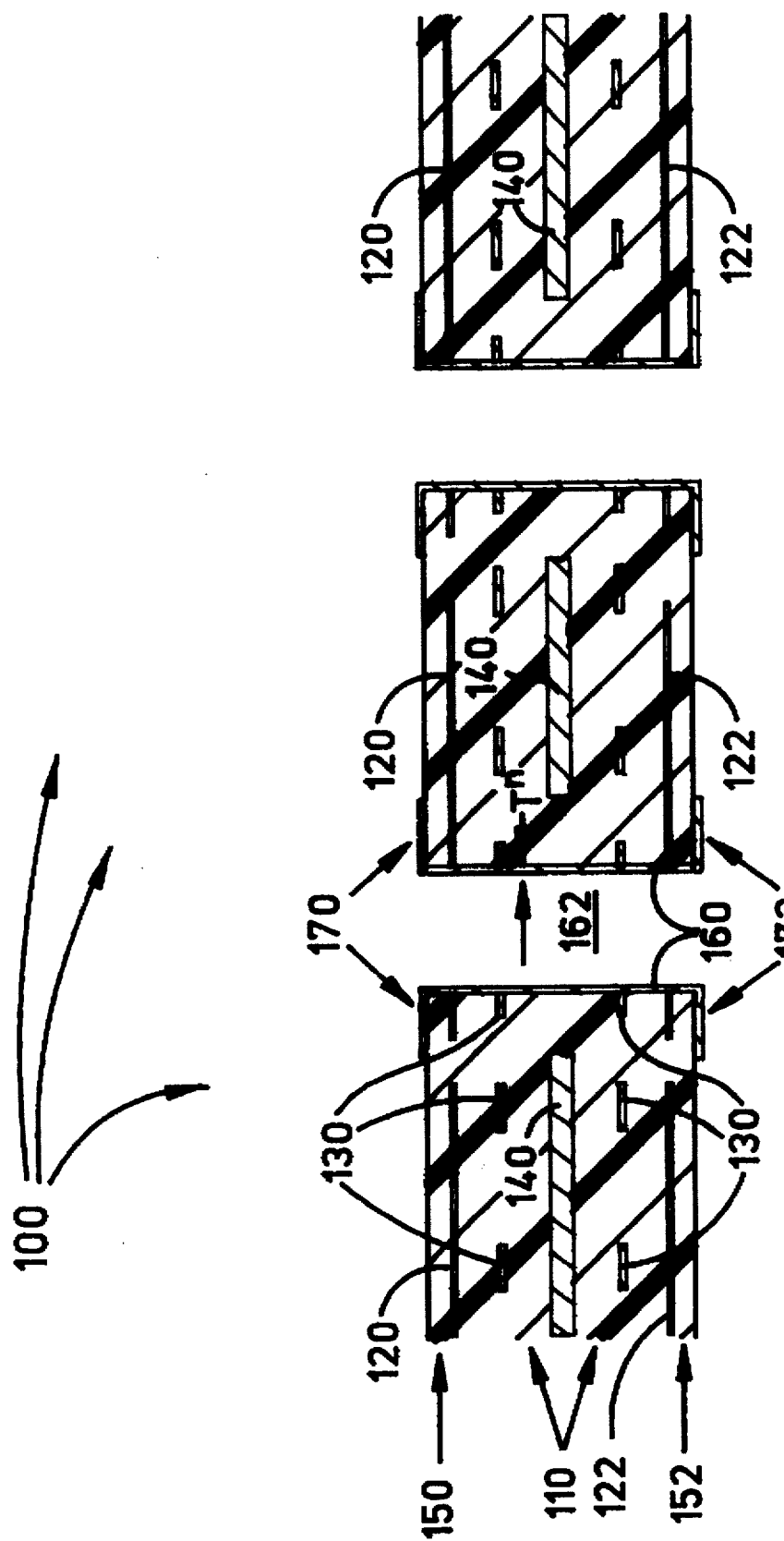
FIG. 1 is a cross-section of a portion of a core 100 before lamination into a multilayer structure, illustrating power planes, signal lines a compensator, and plated through-holes.

This invention is described in a preferred embodiment in the following description with reference to the Figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

Introduction and General Dscussion of Multilayer Structures

The following disclosure and associated drawings define a process for making a multilayer circuit board assembly from a plurality of core subassemblies, termed "cores" herein, each of which is formed of a plurality of dielectric and conductive layers. The final assembly includes a plurality of cores joined together in a predetermined manner using heat and compression to provide an end product having the operational characteristics (e.g., wiring density and resistance) desired for any given particular design. In the following Figs. and discussion, various steps and structure for a multilayer circuit are shown in accordance with one embodiment of the invention. It should be understood that the configuration depicted in these Figs. is representative of only one version of such cores and the multilayer circuit formed therefrom, and the invention is thus not limited thereto.

One key technology advance for multilayer structures is "stacked through-hole joining", in which through-holes are aligned and connected to provide electrical links between layers in different cores or between one or more cores and an external component that is connected to the through-hole. The joining of stacked through-holes eliminates the need for the conventional large diameter PTHs because instead of PTHs, composite interconnections are created by joining a stack of small diameter vias, created by drilling and plating fine (small diameter) vias in each core individually. Because the through-holes are formed in each core in a separate process, each core can be individually inspected, tested, and repaired if necessary before joining it with the other cores. This capability to individually inspect, test, and repair the part greatly enhances the yield in the final product of the manufacturing process while also serving to substantially shorten manufacturing time and assure overall cost savings. The use of stacked through-holes provides a multilayer structure with greater wiring density, as well as greater interconnect flexibility due to capabilities for multiple z-axis interconnections and hierarchical wiring structures. It is within the scope of the present invention to produce a multilayer circuit board assembly formed of two or more core subassemblies. For example, it is possible to produce a multilayer assembly including twenty individual core assemblies.

The stacked through-hole joining process requires that the via lands and dielectric surfaces of adjacent cores be aligned and in intimate contact before joining. During joining, moderate pressure is applied to the lamination stack. As is known in the art, the through-holes are designed to compress by, for example 10%, during joining, which removes the standoff effect of the through-holes and meets any distributed plating and material thickness tolerances. The term "compression" as used herein is meant to define a condition of reduced height for the invention's through-holes as a result of being subjected to pressures typically associated with such processes as lamination. Under such definition, it should be understood that some deformation of the through-hole and surrounding structures must occur.

Core and Features

Figure 4:
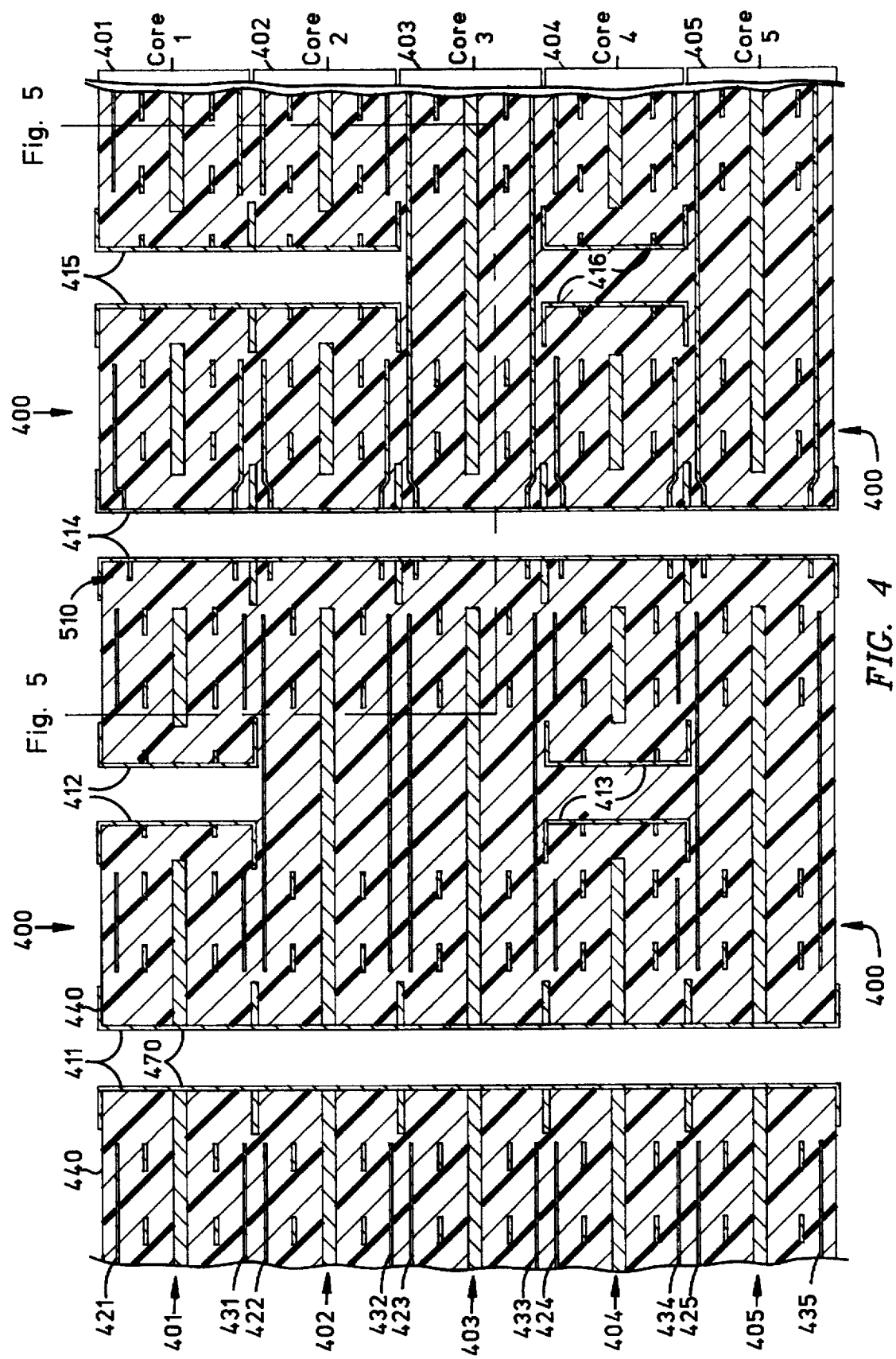
FIG. 4 is a cross-section of the high performance multilayer structure after compression, illustrating the deformed hinged interconnects of the invention.

Reference is now made to FIG. 1 which is a cross section of a portion of a core 100 before its lamination into a multilayer structure (and therefore before compression). The core 100 is one of multiple cores that can be laminated to other cores in a process that includes heating and compression to form a multilayer printed circuit structure, such as shown in FIG. 4 and discussed with reference thereto. The core 100 includes dielectric material 110 in which one or more conductive layers are embedded. The conductive layers include power planes that comprise substantially planar conductive units, including an upper shield plane 120, a lower shield plane 122, and a compensator 140. In some conductive layers, a plurality of signal lines 130 are provided to route signals in accordance with a predetermined pattern. The conductive layers comprise a highly conductive material such as copper. The upper shield plane 120 is positioned proximate to an upper surface 150 of the core 100, and extends across the entire core 100 as a single conductive unit. The lower shield plane 122 is positioned proximate to a lower surface 152 of the core 100, and likewise extends across the entire core 100 as a single conductive unit. The compensator 140 is positioned in the center of the core 140 and also extends across the entire core 100 as substantially a single conductive unit. The compensator 140 is provided in this particular design as a copper-clad metal that has an expansion coefficient chosen to compensate for thermal expansion of the core 100. The compensator 140 can also be used as a power plane.

The signal lines 130 are routed in a complex pattern predetermined to meet design goals. Particularly, the configuration of signal lines and other conductive layers (e.g., the absence or presence of signal lines and conductors) is determined by the desired electrical connections of the final multilayer circuit board. Although a particular configuration is illustrated in FIG. 1, it should be understood that other cores may include a different number of power planes, signal lines, and dielectric layers, and that a different predetermined pattern may be utilized. For example, another embodiment of a core may include ten conductive layers, strategically positioned in accordance with a predefined pattern. In some instances, a signal line and/or a conductive layer is electrically connected to the through-hole.

The core includes a through-hole 160 with a centrally-located hollow cylindrical portion 162 that extends through the entire thickness of the core 100. At the upper surface 150 of the core, an outwardly extending upper via land 170 is provided projecting from the centrally-located hollow cylindrical portion 162 of the through-hole. Similarly, at the lower surface 152 of the core, an outwardly extending lower via land 172 is provided projecting from the centrally-located hollow cylindrical portion 162 of the through-hole. Each through-hole preferably comprises copper or a similarly conductive material. The circular outer perimeter of the through-hole 162 and the via land 170 are formed within the through-hole 160 by any known technique such as electroplating a conductive material such as copper. Although only two through-holes are shown in FIG. 1, it should be understood that the core is not limited to this number, and likely will have many more. For example, in one embodiment, several thousand through-holes are utilized in a predefined pattern determined to align with the several thousand through-holes on an adjacent core.

The copper material comprising the lining of each through-hole has a thickness, represented by the letter "T" in FIG. 1, sufficient to allow the through-hole to compress during later production of the multilayer circuit board. For example, in a preferred embodiment, the copper lining has a thickness sufficient to allow the through-hole to compress by 10% of its length. Such compression is useful to assure proper engagement (and therefore electrical coupling) between the via lands throughout a multilayer structure.

The dielectric material 110 preferably comprises a dielectric material such as PTFE or the like that has a melting point above the bonding temperature of the bonding metals, so that the dielectric material can be heated sufficiently to flow as desired without migrating into the through-hole jointure that will be formed between the via lands on opposing surfaces of adjacent cores. The dielectric material 110 may also include a filler material (e.g. silicon dioxide in particle form).

Description of the Interconnect Between the Through-hole and the Conductive Layer Conventional connections between power planes and through-holes have included a direct connection in which an aperture in the power plane is connected around its entire perimeter to the through-hole. As discussed in the background section, this "direct" connection has serious difficulties due to the power plane's resistance to the inevitable reference plane deformation that will occur during heating and compression during production of a multilayer structure.

Figure 2:
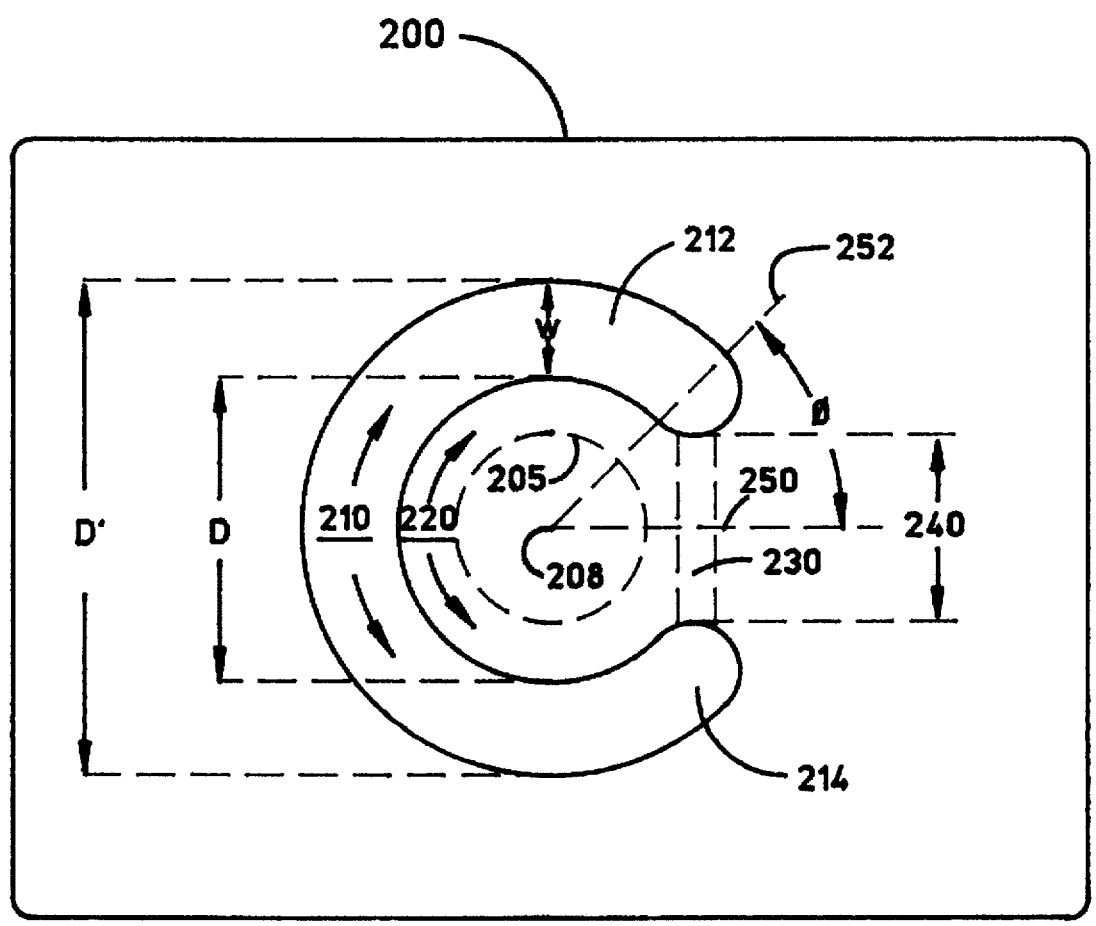
FIG. 2 is a top view of a section of a power plane including the hinged interconnect of the preferred embodiment.

Reference is now made to FIG. 2, which is a top view of a section of a power plane 200 that is intended to be connected to a through-hole such as illustrated in the core of FIG. 1. The intended location of the through-hole is illustrated by a circle 205 shown by dotted lines, having a center 208 that defines the center of the through-hole's aperture. In FIG. 2, the through-hole does not yet exist because it will be drilled only after the power plane 200 has been laminated to form a core structure such as shown in FIG. 1. A semicircular C-shape 210, including an upper arm 212 and a lower arm 214 is etched or otherwise formed in the power plane 200 by any suitable process in a position approximately evenly around the intended location 205 of the through-hole. Etching (i.e. removing) the semicircular C-shape 210 from the power plane 200 leaves conductive sections remaining including a central conductive pad 220 and a hinge 230 connected to the pad 220. The central pad 220 surrounds the intended through-hole 205, and is electrically coupled thereto. Thus, the hinge electrically and mechanically connects the central conductive pad to the power plane 200. Although the precise dimensions of the C-shape 210 and the hinge 230 are not critical and will vary between embodiments, the width 240 of the hinge, defined between the upper and lower arms 212 and 214 of the C-shape 210, is chosen to be small enough to allow substantial deformation at the hinge while being large enough to maintain the desired electrical and mechanical integrity of the hinge during and after compression. In one embodiment, the width of the etched C-shaped feature, illustrated by "W," is sixty microns, the diameter of the central pad, illustrated by "D," is 230 microns, the entire diameter of the C-shaped etched feature, illustrated by "D'" is 350 microns, and the angle, illustrated by $\phi$, is 45° between a line 250 drawn from the center 208 of the through-hole to the center width of the hinge 230 and a line 252 drawn from the center 208 of the through-hole to either the upper arm 212 or the lower arm 214.

Figure 3:
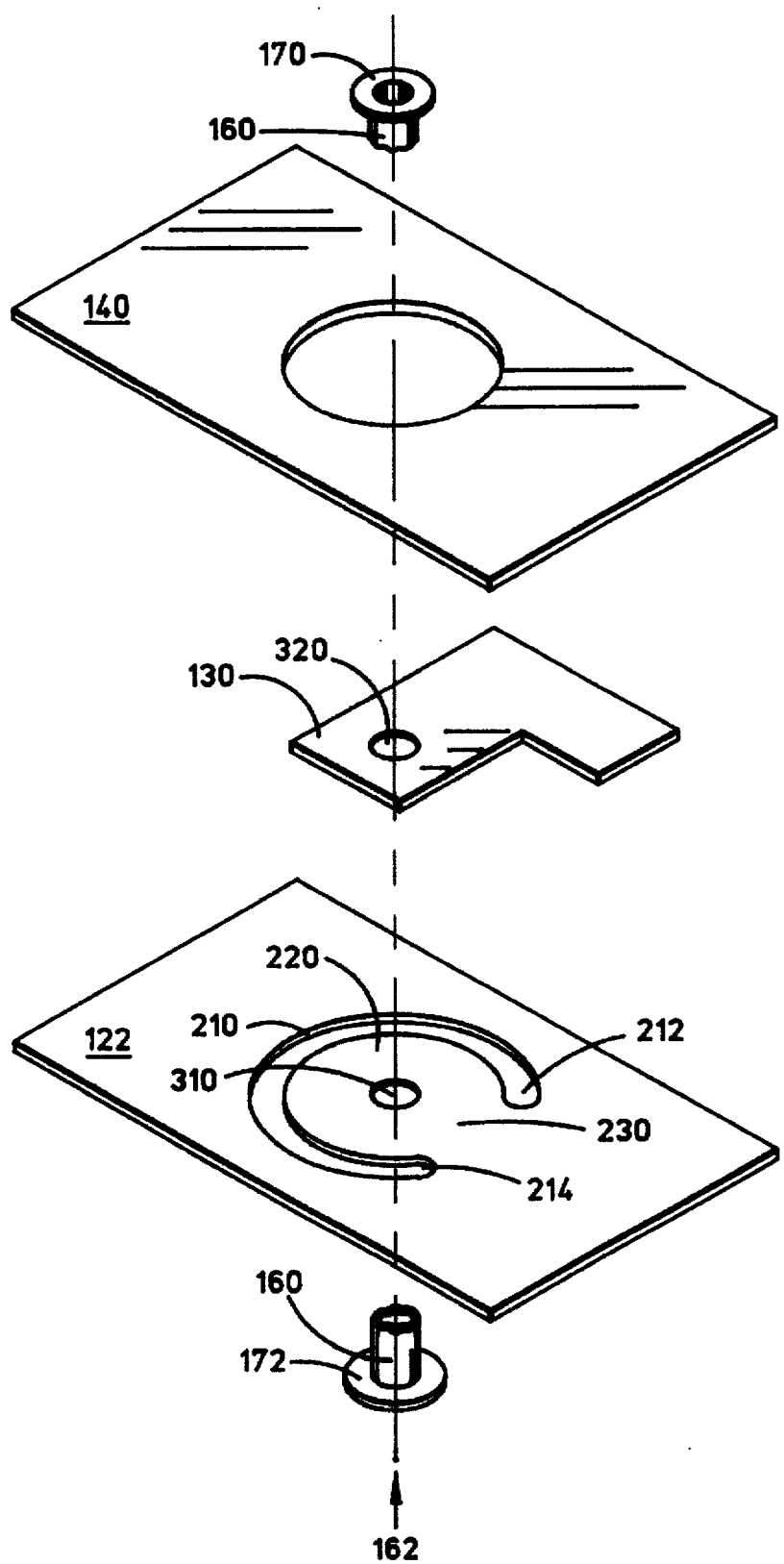
FIG. 3 is a perspective view of the conductive layers exploded from a section of the core shown in FIG. 1, including the hinged interconnect of the preferred embodiment.

Reference is now made to FIG. 3 which is a perspective view of the conductive layers exploded from a section of the core illustrated in FIG. 1 surrounding the through-hole 160. In order to facilitate understanding, the dielectric material that normally resides between and around the conductive layers is not shown in FIG. 3.

FIG. 3 illustrates the relative position of the shield plane 122, the C-shape 210 shown in FIG. 2, the central pad 220, and the hinge 230 with respect to the through hole 160. As discussed earlier, the circular outer perimeter of the through-hole 162 and the via land 170 are formed within the through-hole 160 by any known technique such as electroplating a conductive material such as copper. As a result, the through-hole 162 is electrically coupled to the power plane 122 through a suitably-sized circular aperture 310 formed in the central pad 220. Likewise, the circular outer perimeter 162 of the through-hole 160 is electrically coupled to the signal line 130 through a suitably-sized circular connection aperture 320 formed in the signal line 130. In the embodiment of FIG. 3, the compensator 140 is not connected to the through-hole 160 and therefore a circular clearance aperture 330 is formed to isolate the compensator from the through-hole.

In an alternate embodiment, where it would be desirable to couple the compensator 140 to the through-hole, the compensator could be coupled directly to the though-hole without the necessity for including the C-shape, because it is centrally-positioned and therefore not subject to the same deformational stresses experienced by the more remotely-positioned shield planes 120 and 122.

Description of Compressed Multilayer Structure and Process for Making It

Reference is now made to FIG. 4 which is a cross-section of a high performance multilayer structure that has been compressed as part of the lamination process. Particularly, the multilayer structure has been laminated by a process including application of heat and compression of a plurality of cores. During the process, pressure is applied equally from the top and bottom of the multilayer structure, in the direction indicated by force arrows 400. A suitable multilayer joining process is illustrated in U.S. Pat. No. 5,359,767 to Chen et al., entitled "Method of Making Multilayered Circuit Board", assigned to the same assignee as the present invention, and incorporated by reference herein. The Chen et al. patent describes a method that utilizes Transient Liquid Bonding (TLB) techniques to bond the cores together.

One example of a Transient Liquid Bonding (TLB) process is disclosed in U.S. Pat. No. 5,280,414 to Davis et al. As described therein, the TLB process is a diffusion bonding process that involves deposition of different conductive surface metals which together are capable of forming a eutectic melt. The surfaces being bonded have a metallic surface comprising a highly conductive metal such as copper that is coated with the bonding metals. The two surfaces are brought into physical contact with one another and then heated to an initial eutectic temperature, which causes the bonding metals to melt and diffuse together in a percentage sufficient to form a first alloy that then solidifies at the initial eutectic temperature. The solidified first alloy is then heated to a greater temperature, causing it to melt and diffuse further with the adjacent bonding metal to form a second alloy through further diffusion, resulting in bonding of the metallic surfaces.

As disclosed in Chen et al., the lamination process for the multilayer structure includes precisely aligning the through-holes and then compressing them at a predetermined pressure (e.g. 300 psi). The compressed structure is then heated to a first temperature (e.g. 300° C.) for an established time period, resulting in formation of an initial bond between the two through-holes. The resulting alloy formed from this initial bond possesses a melting point significantly greater than that of the subassembly dielectric (e.g. PTFE). Following this time period, the compressed subassemblies are again heated to a second, even greater temperature (e.g. 380° C.) for a second established time period sufficient to assure dielectric flow within the multilayer structure. The subassembly is then cooled and the pressure removed. The method disclosed by Chen et al. promotes effective engagement between respective pairs of through-holes in the compressed cores; and prevents dielectric incursion through the bond formed between the respective aligned through-holes that could otherwise adversely affect the electrical connection between adjacent cores.

Referring still to FIG. 4, which is a cross-sectional view of one embodiment of a multilayer high performance circuit card, several different types of through-holes and some of the features available on a multilayer circuit board are described. The illustrated embodiment is formed of five cores, including a first (top) core 401, a second core 402, a third core 403, a fourth core 404, and a fifth (bottom) core 405. A dielectric material, preferably PTFE, is disposed between the conductives layers in each of the cores.

Several types of through-holes are illustrated, including a first through-hole 411 that extends from the top surface of the first core 401 all the way to the bottom surface of the fifth core 405, a second through-hole 412 that extends only through the first core 401, a third through-hole 413 that extends only through the fourth core 404, a fourth through-hole 414 that extends from the top surface of the first core 401 all the way to the bottom surface of the fifth core 405, a fifth through-hole 415 that extends from the top surface of the first core 401 to the bottom surface of the second core 402, and a sixth through-hole 416 that extends only through the fourth core 404. The third and the sixth through-holes are entirely internally-positioned; that is, they have no external openings.

Each core includes two shield planes positioned proximate to the outside edges that define the respective core. Specifically, the first core 401 includes an upper shield plane 421 positioned proximate to the upper surface of the first core and a lower shield plane 431 positioned proximate to the lower surface of the first core. Likewise, the second core 402 includes an upper shield plane 422 and a lower shield plane 432, the third core 403 includes an upper shield plane 423 and a lower shield plane 433, the fourth core 404 includes an upper shield plane 424 and a lower shield plane 434, and the fifth core 405 includes an upper shield plane 425 and a lower shield plane 435.

Each of the upper and lower shield planes comprise substantially a single conductive sheet, with gaps in the conductive surface for avoiding a through-hole by utilizing a clearance aperture, or alternatively, for connecting to a through-hole using the interconnection described herein. For example, in the first core 401, the upper shield plane 421 includes a clearance aperture 440 surrounding the first through-hole 411, in order to avoid connecting thereto. Likewise, the upper shield plane 421 includes a clearance hole 441 surrounding the second through-hole 412. However, the upper shield plane 421 connects to the fourth through-hole 414, and therefore the interconnection includes the inventive interconnection described herein with reference to FIG. 5.

Each of the cores comprises a compensator layer positioned in the middle plane therein to compensate for thermal expansion. Specifically, the first core 401 comprises a first compensator 441 extending therethrough, the second core 402 comprises a second compensator 442 extending therethrough, the third core 403 comprises a third compensator 443 extending therethrough, the fourth core 404 comprises a fourth compensator 444 extending therethrough, and the fifth core 405 comprises a fifth compensator 445 extending therethrough. In one embodiment, the compensators include a copper-clad metal that has an expansion coefficient chosen to compensate for thermal expansion of the core in which it resides.

Figure 5:
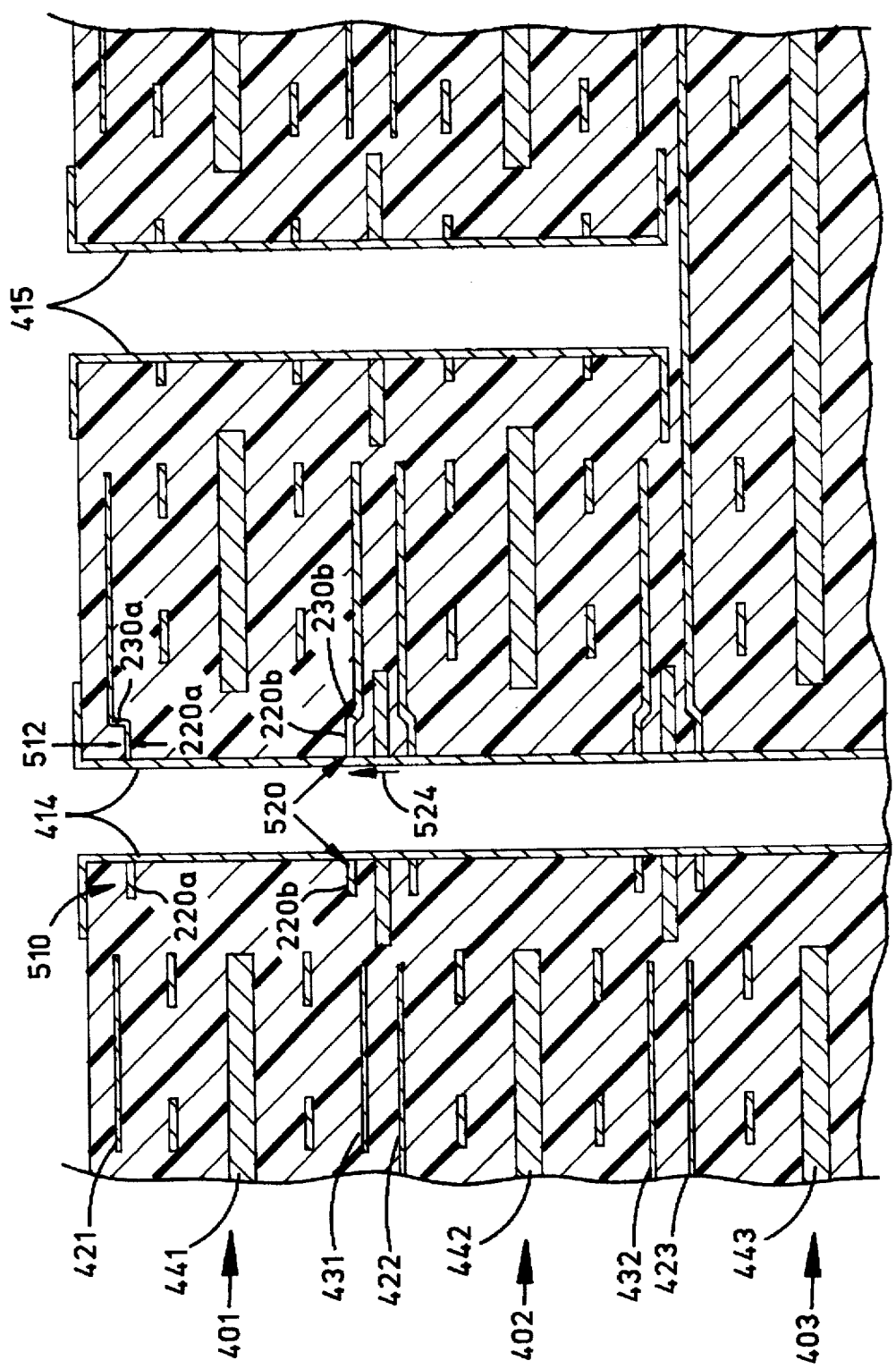
FIG. 5 is an enlarged view of a portion of the laminated multilayer structure of FIG. 4, illustrating a first core, second core and a third core proximate to a through-hole.

Reference is now made to FIG. 5 which is an enlarged view of the portion of the laminated multilayer structure of the first core 401, the second core 402, and the third core 403 of FIG. 4, proximate to the fourth through-hole 414. The upper shield plane 421 connects to the fourth through-hole 414 at a first interconnection shown generally at 510. The first interconnection 510 includes a first central pad 220a coupled to the fourth through-hole and a first hinge 230a coupled to the first central pad and the upper shield plane 421. The first hinge 230a has been deformed as a result of compressing the fourth through-hole 414, along with all other through-holes during production of the multilayer structure. Particularly, while the upper shield plane 421 remains in approximately the same plane, compression has caused the central pad 220a and the first hinge 230a to be deformed toward the middle plane of the first core, as illustrated by an arrow 512. The middle plane is positioned halfway through the thickness of the core, and in this embodiment the middle plane is defined by the first compensator layer 441 extending therethrough. Using the convention used for FIGS. 4 and 5, the first hinge 220a has been deformed so that the first central pad 220a is forced downwardly with respect to the upper shield plane 421. A second interconnection, illustrated by 520, connects the lower shield plane 431 of the first core with the fourth through-hole 414, and includes a second central pad 220b and a second hinge 230b. Like the first central pad 220a and the first hinge 220a, the second central pad 220b and the second hinge 230b have been deformed in a direction toward the middle plane of the first core as a result of compressing the fourth through-hole during production of the multilayer structure. The direction of deformation for the second interconnect 520 is illustrated by an arrow 524 which points upwardly with respect to the lower shield plane 431. Compression causes the first central pad 220a to be forced closer to the second central pad 220b, while the upper shield plane 421 and the lower shield plane 431 remain approximately the same distance apart as before compression. This compressed structure is repeated wherever the upper and lower shield planes are connected to a through-hole, for example at the connections between the fourth through-hole and the second core 402.

It should be apparent that, because the compressive deformation is directed toward the middle plane of each core, if a connection between a power plane and a through-hole is sufficiently close to this middle plane, the deforming forces will be so minimal that a direct connection will be adequate and cost-effective. For example, as shown in FIG. 4, the first through-hole 411 is coupled to the compensator layer 441 of the first core 401 with a direct connection shown at 470, because the compensator plane resides in the middle plane. Likewise, a direct connection is used to connect the compensator planes in the second, third, fourth, and fifth cores with the first through-hole because the respective compensator planes reside in the middle plane of each core.

Cross-sectional Depictions of Multilayer Structures

Figure 6:
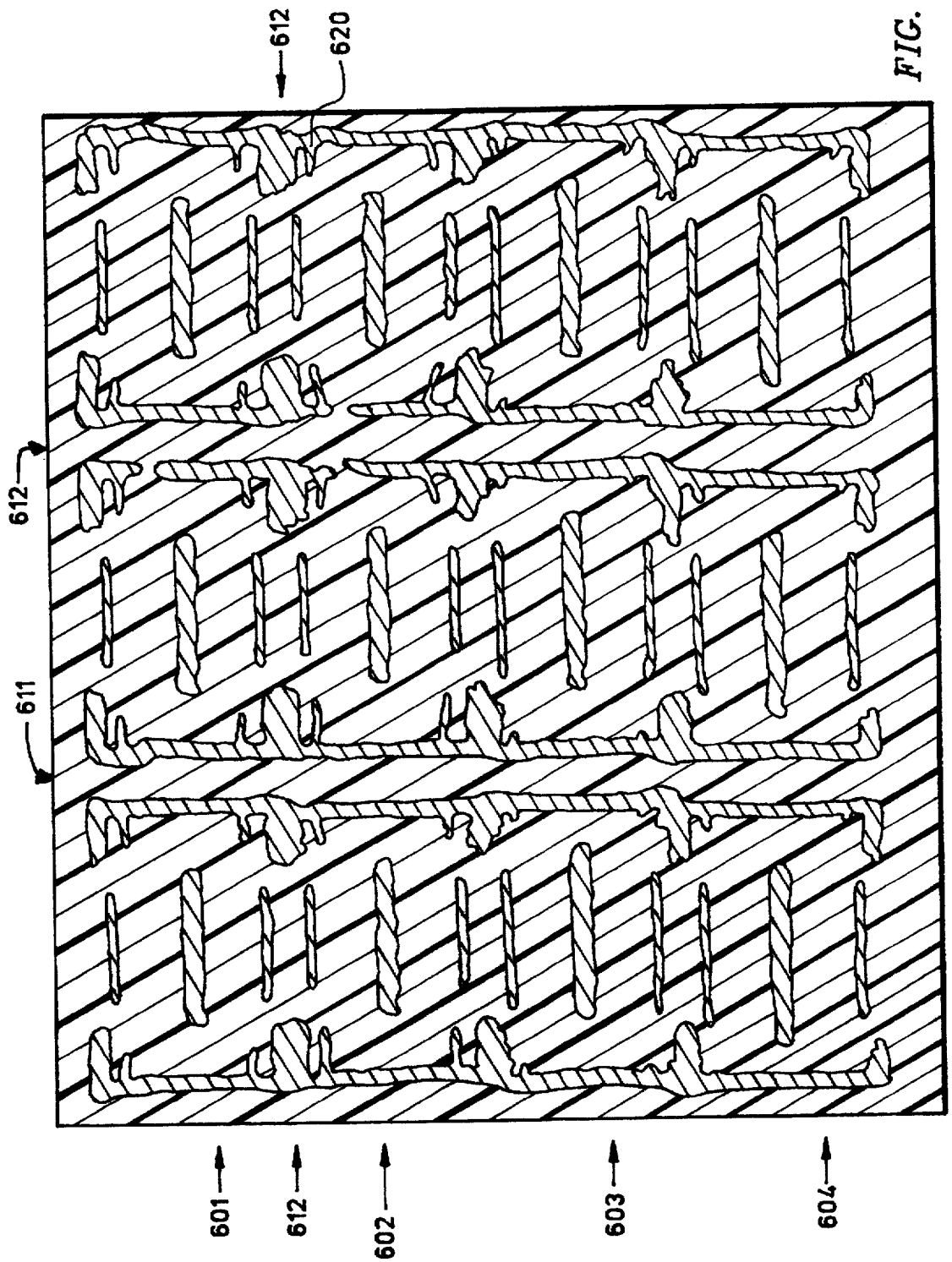
FIG. 6 is a cross-section of a portion of a multilayer structure that utilizes the through-hole interconnect of the preferred embodiment.

Reference is now made to FIG. 6 which is a cross-section of a portion of a multilayer structure formed of a first (top) core 601, a second core 602, a third core 603, and a fourth (bottom) core 604. The multilayer structure defines a first through-hole 611 and a second through-hole 612. The shield layers are coupled to the through-holes using the C-shaped through-hole interconnect described herein, and as a result, the shield planes advantageously remain substantially planar. Using the right-hand side of the second core 602 as an example, the central pad 620 has been forced downwardly as a result of compressive forces, and the hinge (not shown) has been deformed accordingly, and as a result, the upper shield plane 612 retains its respective relationship to two signal lines proximate thereto. Therefore, the impedance seen by these two signal lines is not affected, in contrast to conventional connections such as shown in FIG. 7.

Figure 7:
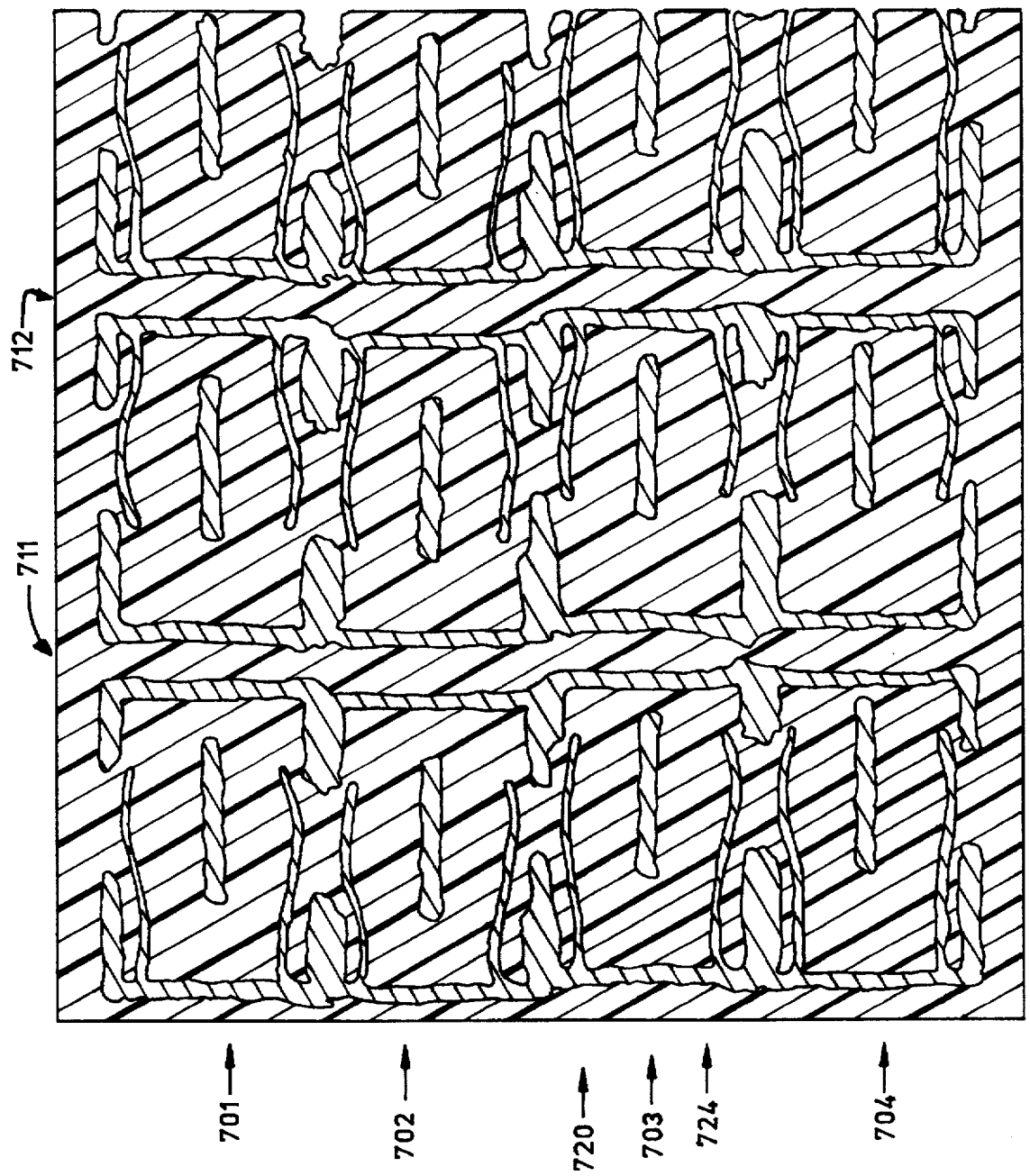
FIG. 7 is a cross-section of a stack-joined multilayer structure that has direct interconnections in the power planes.

FIG. 7 is a cross-section of a stack-joined multilayer structure formed of a first core 701, and second core 702, a third core 703, and a fourth core 704 utilizing conventional direct connections with a first through-hole 711 and a second through-hole 712. FIG. 7 shows that, when conventional direct connections are utilized, substantial deformation of the power plane can result. Using the third core 703 as an example, its upper shield plane 720 and the lower shield plane 724 both show the effects of substantial deformation. The deformation is particularly troublesome in its effect on the two signal lines proximate to the lower shield plane 724, because their impedance will be degraded by the non-uniformity proximate thereto in the lower shield plane 724.

Thus, FIG. 6 illustrates the reduced stress that occurs in a multilayer structure when the inventive hinged interconnects are utilized between the through-holes and power planes, thereby allowing the power plane to remain substantially planar, and avoiding impedance discontinuities. Thus, a multilayer circuit board structure is provided that has high performance, is reliable, and can be manufactured with high yield and resulting low cost.

Figure 8:
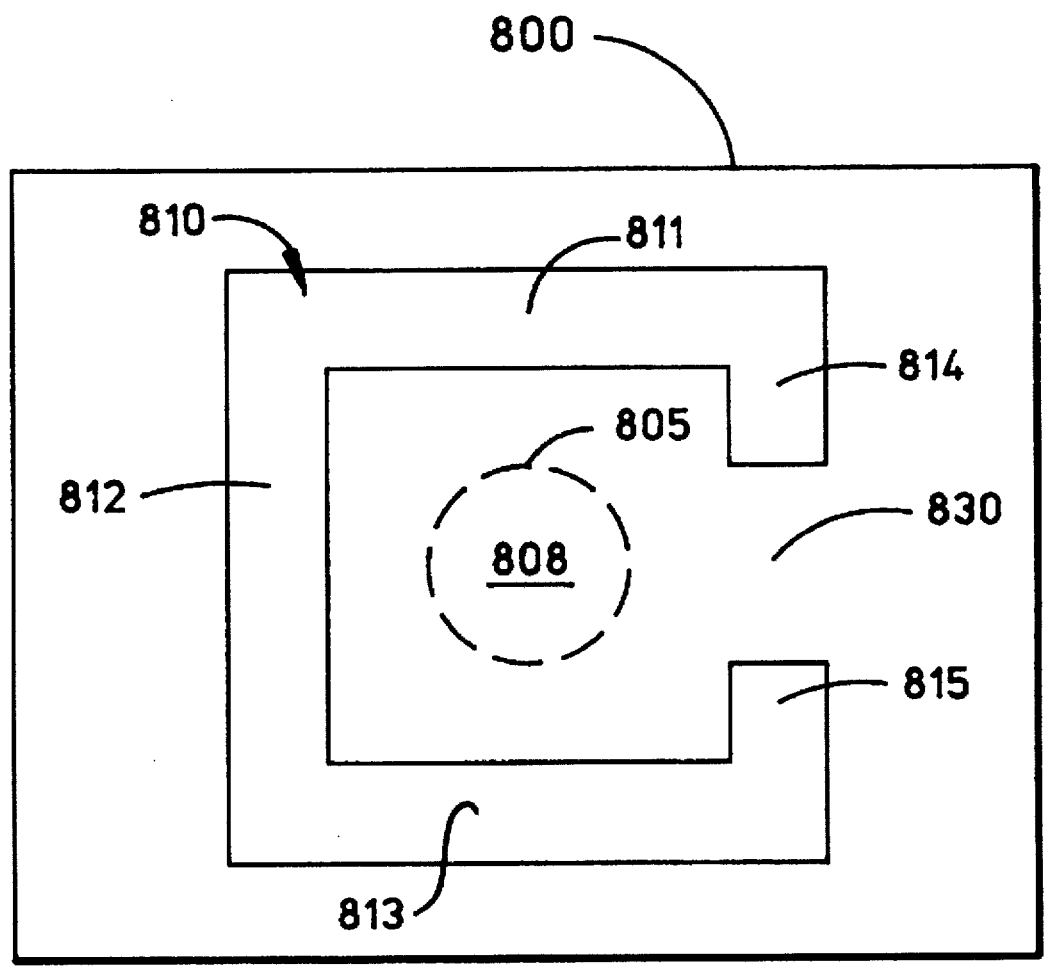
FIG. 8 is a top view of an alternative embodiment of a power plane interconnect that includes a semi-rectangular shape.

Other embodiments and modifications of this invention may occur to those of ordinary skill in the art in view of these teachings. For example, although the hinged interconnect shown in FIGS. 2 and 3 has a C-shape in the preferred embodiment, other non-continuous shapes could be utilized. For example FIG. 8 shows a top view of a section of a power plane 800 that is intended to be connected to a through-hole such as illustrated in the core of FIG. 1. The intended location of the through-hole is illustrated by a circle 805 shown by dotted lines, having a center 808 that defines the center of the through-hole's aperture. A semi-rectangular shape 810 is etched or otherwise formed in the power plane 200 by any suitable process in a position approximately evenly around the intended location 805 for the through-hole. The semi-rectangular shape includes a first straight section 811, a second straight section 812, and a third straight section 813 that define three complete sides of the semi-rectangle. The fourth side of the semi-rectangle comprises two separate sections, including a fourth straight section 814 and a fifth straight section 815, separated by a hinge area 830. Etching (i.e. removing) the semi-rectangular shape 810 leaves conductive sections remaining including a central conductive pad 820 and the hinge 830 connected thereto. The central pad 820 surrounds the intended through-hole 805, and electrically and mechanically connects the central pad to the power plane 800 through the hinge 830. The semi-rectangular shape 810 can have the dimensions of a square, as illustrated, or can have other dimensions.

The etched semi-rectangular shape 810 and the etched C-shape 210 are only two of the many polygonal and curved non-continuous shapes that can be used to form a hinged interconnect, and the invention is not limited thereto. Furthermore, the term "etching" or "etched" is used in its broadest sense to describe an area that has been removed from a conductive layer by any process or method including that described herein.

This invention is to be limited only by the following claims, which include all such embodiments and modifications when viewed in conjunction with the above specification and accompanying drawings.

We claim:

1. A method of making a multilayer circuit board comprising the steps of:
   forming a first core circuit board by:
      forming a plane conductor,
      etching an area substantially surrounding a predetermined location for a through-hole in said plane conductor to define a central pad for coupling to a through-hole and a hinge area that connects the central pad with the plane conductor,
      laminating the first core circuit board by connecting the plane conductor and a plurality of dielectric layers, and
      forming a first through-hole through the central pad in the first core circuit board;
   forming a second core circuit board having a second through hole therein: and
   connecting the first and second core circuit boards by aligning said first and second core circuit boards, compressing and heating said core circuit boards, and deforming the hinge in the plane conductor such that at least a portion of the central pad is outside the plane defined by the plane conductor.

2. The method of claim 1 wherein etching includes etching said area into a semicircular shape.

3. The method of claim 1 wherein etching includes etching said area into a semi-rectangular shape.

4. The method of claim 1 wherein etching includes etching said area into a semi-square shape.

5. The method of claim 1 wherein connecting includes laminating said first and second core circuit boards together using a transient liquid bonding ("TLB") process.

6. The method of claim 5 wherein said first and second core circuit boards each comprise a via land surrounding an opening of the first and second through holes, respectively, on adjacent surfaces of the cores, respectively, and connecting further comprises joining the lands using the transient liquid bonding process.

7. A circuit board comprising:
   at least one plated through-hole formed in said circuit board;
   a plane conductor having a main body that is substantially planar, a deformed hinge connected thereto and an interconnect area that electrically couples the deformed hinge and the through-hole, said interconnect area including a conductive pad connected to said through-hole and said hinge and an etched area surrounding said conductive pad, said hinge being deformed to position the interconnect area substantially outside of the plane defined by the main body of the plane conductor.

8. The circuit board of claim 7 wherein said etched area surrounding said conductive pad has a semi-circular shape.

9. The circuit board of claim 7 wherein said etched area surrounding said conductive pad has a semi-rectangular shape.

10. The circuit board of claim 7 wherein said etched area surrounding said conductive pad has a semi-square shape.

11. A multilayer laminated circuit board comprising:
   a plurality of core assemblies laminated together in a stacked configuration;
   a plurality of plated through-holes defined in said multilayer laminated circuit board; and
   at least one core assembly of said plurality core assemblies coupled to at least one plated through-hole of said plurality of plated through-holes and including:
      a plane conductor having a main body that is substantially planar, a deformed hinge connected to said main body, and an interconnect area coupled to said hinge, said interconnect area including a conductive pad electrically coupled to said at least one plated through-hole and said hinge and an etched area surrounding said conductive pad, said hinge being deformed so that the interconnect area is aligned outside of the plane defined by the plane conductor.

12. The multilayer laminated circuit board of claim 11 wherein said etched area surrounding said conductive pad has a semicircular shape.

13. The multilayer laminated circuit board of claim 11 wherein said etched area surrounding said conductive pad has a semi-rectangular shape.

14. The multilayer laminated circuit board of claim 11 wherein said etched area surrounding said conductive pad has a semi-square shape.

* * * * *